(12) United States Patent
Matsuzawa et al.

(10) Patent No.: US 9,577,661 B2
(45) Date of Patent: Feb. 21, 2017

(54) VOLTAGE-CONTROLLED OSCILLATOR AND ANALOG-DIGITAL CONVERTER

(71) Applicants: DENSO CORPORATION, Kariya, Aichi-pref. (JP); TOKYO INSTITUTE OF TECHNOLOGY, Tokyo (JP)

(72) Inventors: Akira Matsuzawa, Tokyo (JP); Masaya Miyahara, Tokyo (JP); Tomohito Terazawa, Kariya (JP)

(73) Assignees: DENSO CORPORATION, Kariya, Aichi-pref. (JP); TOKYO INSTITUTE OF TECHNOLOGY, Tokyo (JP)

( * ) Notice: Subject to any disclaimer, the term of this patent is extended or adjusted under 35 U.S.C. 154(b) by 0 days.

(21) Appl. No.: 15/150,663

(22) Filed: May 10, 2016

(65) Prior Publication Data

US 2016/0336955 A1    Nov. 17, 2016

(30) Foreign Application Priority Data

May 14, 2015 (JP) ................................. 2015-099400

(51) Int. Cl.
*H03M 1/60* (2006.01)
*G05F 1/56* (2006.01)
*H03K 3/03* (2006.01)
*H03F 3/45* (2006.01)

(52) U.S. Cl.
CPC ............... *H03M 1/60* (2013.01); *G05F 1/561* (2013.01); *H03F 3/45* (2013.01); *H03K 3/0315* (2013.01)

(58) Field of Classification Search
None
See application file for complete search history.

(56) References Cited

U.S. PATENT DOCUMENTS

| | | | |
|---|---|---|---|
| 5,396,247 A | 3/1995 | Watanabe et al. | |
| 6,111,463 A * | 8/2000 | Kimura | G06G 7/163 327/359 |
| 6,704,560 B1 * | 3/2004 | Balteanu | H03F 1/3211 330/257 |
| 8,542,138 B2 * | 9/2013 | Galton | H03M 3/388 341/118 |

(Continued)

FOREIGN PATENT DOCUMENTS

| | | |
|---|---|---|
| JP | H05-259907 | 10/1993 |
| JP | H06-021776 | 1/1994 |

*Primary Examiner* — Howard Williams
(74) *Attorney, Agent, or Firm* — Harness, Dickey & Pierce, P.L.C.

(57) ABSTRACT

A voltage-controlled oscillator includes a voltage-current converter, a first ring oscillator and a second ring oscillator. The voltage-current converter includes a first transistor for receiving a first control voltage at its gate terminal, a second transistor for receiving a second control voltage at its gate terminal, a third transistor connected to the first transistor in series and has a gate terminal connected to a drain terminal of the first transistor, a fourth transistor connected to the second transistor in series and has a gate terminal connected to a drain terminal of the second transistor, a resistor connected to a source terminal of the first transistor and a source terminal of the second transistor, a fifth transistor having a gate terminal connected to the drain terminal of the first transistor, and a sixth transistor having a gate terminal connected to the drain terminal of the second transistor.

9 Claims, 6 Drawing Sheets

(56) References Cited

U.S. PATENT DOCUMENTS

| | | | |
|---|---|---|---|
| 8,742,970 B2 * | 6/2014 | Lesso | H03M 1/34 341/157 |
| 2010/0321067 A1 * | 12/2010 | Hurwitz | H03G 3/001 327/103 |

* cited by examiner

VOLTAGE-CONTROLLED OSCILLATOR AND ANALOG-DIGITAL CONVERTER

CROSS REFERENCE TO RELATED APPLICATION

The present application is based on Japanese patent application No. 2015-99400 filed on May 14, 2015, the content of which is incorporated herein by reference.

FIELD

The present disclosure relates to a voltage-controlled oscillator including a voltage-current converter and an analog-digital converter including the voltage-controlled oscillator.

BACKGROUND ART

A conventional voltage-controlled oscillator includes a constant current control circuit and a ring oscillator as disclosed exemplarily in JP H06-21776 A. In this voltage-controlled oscillator, the constant current control circuit receives a control voltage and outputs a current proportional to the control voltage to the ring oscillator.

The constant current control circuit includes an operational amplifier. The control voltage is applied to a non-inverting input terminal of an operational amplifier. An output terminal of the operational amplifier is connected to a gate terminal of an N-channel transistor. A resistor is provided between the N-channel transistor and the ground. A voltage between the N-channel transistor and the resistor is applied to an inverting input terminal of the operational amplifier.

According to this configuration, a current flowing in the resistor is determined by dividing a control voltage value by a resistance value of the resistor. The constant current control circuit thus outputs the current to the ring oscillator in proportion to the control voltage.

A conventional analog-digital converter exemplarily disclosed in JP H05-259907 A (U.S. Pat. No. 5,396,247) includes a circulation circuit, which is formed of plural delay elements connected in a ring form, and outputs as analog-digital conversion data a numeric value, which indicates a number of circulations of a signal through the circulation circuit and a position of circulation of the signal in the circulation circuit.

Since the constant current control circuit disclosed in JP H06-21776 A includes the operational amplifier, the output current tends to lose proportionality to the control voltage when the control voltage becomes a high frequency signal. When the output current of the constant current control circuit loses proportionality to the control voltage, an oscillation signal generated by the voltage-controlled oscillator also loses proportionality to the control voltage.

It is possible to produce the output current in proportion to the control voltage by driving transistors of the operational amplifier at high speeds, even when the control voltage is the high frequency signal. The transistors of the operational amplifier however consume more power when driven at high speeds.

The constant current control circuit is a single-end input type. Two current control circuits are needed to process a differential signal. The above-described circuit, which receives the control voltage and outputs the current proportional to the control voltage, is referred to as a voltage-current converter.

SUMMARY

The present disclosure addresses the above-described problem and has an object to provide a voltage-controlled oscillator, which is capable of outputting an oscillation signal having good proportionality to a change in a control voltage with low power consumption even when the control voltage is a high frequency signal, and an analog-digital converter, which includes the voltage-controlled oscillator.

According to one aspect, a voltage-controlled oscillator comprises a voltage-current converter, which receives a first control voltage and a second control voltage and outputs a first output current proportional to the first control voltage and a second output current proportional to the second control voltage, a first ring oscillator, which includes plural delay elements connected in a ring form and oscillates based on the first output current corresponding to the first control voltage, and a second ring oscillator, which includes plural delay elements connected in a ring form and oscillates based on the second output current corresponding to the second control voltage. The voltage-current converter includes a first transistor for receiving the first control voltage at a gate terminal thereof, a second transistor for receiving the second control voltage at a gate terminal thereof, a third transistor connected to the first transistor in series and having a gate terminal connected to a drain terminal of the first transistor, a fourth transistor connected to the second transistor in series and having a gate terminal connected to a drain terminal of the second transistor, a resistor connected to a source terminal of the first transistor and a source terminal of the second transistor, a fifth transistor having a gate terminal connected to the drain terminal of the first transistor, and a sixth transistor having a gate terminal connected to the drain terminal of the second transistor.

According to another aspect, an AD converter comprises the voltage-controlled oscillator described above, a first encoder circuit and a second encoder circuit. The first encoder circuit detects a circulation number indicating a number of circulations of a signal in the first ring oscillator and a circulation position indicating a position of circulation of the signal in the first ring oscillator and outputs as first AD conversion data a first numeric value indicating the circulation number and the circulation position in the first encoder circuit. The second encoder circuit detects a circulation number indicating a number of circulations of a signal in the second ring oscillator and a circulation position indicating a position of circulation of the signal in the second ring oscillator and outputs as second AD conversion data a second numeric value indicating the circulation number and the circulation position in the second encoder circuit.

DETAILED DESCRIPTION OF THE EMBODIMENT

Figure 1:
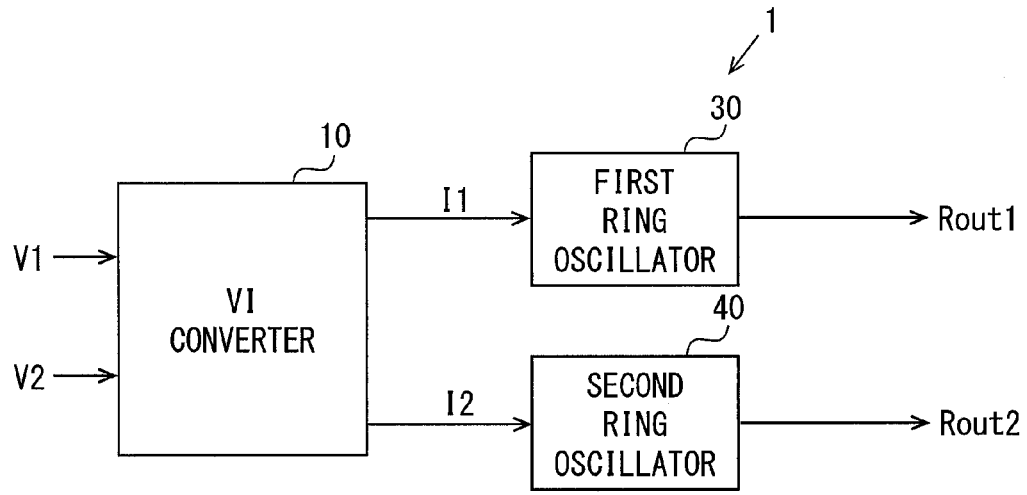
FIG. 1 is a block diagram of a voltage-controlled oscillator according to a first embodiment.

A voltage-controlled oscillator and an analog-digital converter will be described below with reference to plural embodiments shown in the drawings and modifications of the embodiments.

First Embodiment (Voltage-Controlled Oscillator 1)

Referring first to FIG. 1, a voltage-controlled oscillator 1 according to a first embodiment includes a voltage-current converter (VI converter) 10, a first ring oscillator 30 and a second ring oscillator 40.

A first control voltage V1 and a second control voltage V2 are applied to the VI converter 10. The first control voltage V1 and the second control voltage V2 are voltage signals, which are in a differential relation to each other. The VI converter 10 outputs a first output current I1, which varies in proportion to a change in the first control voltage V1, and a second output current I2, which varies in proportion to a change in the second control voltage V2.

The first output current I1 is applied to the first ring oscillator 30 and the second output current I2 is applied to the second ring oscillator 40. The first ring oscillator 30 and the second ring oscillator 40 have the same circuit configuration. The first ring oscillator 30 outputs a first oscillation signal Rout1, which has a first oscillation frequency corresponding to the first output current I1. The second ring oscillator 40 outputs a second oscillation signal Rout2, which has a second oscillation frequency corresponding to the second output current I2.

(VI Converter 10)

Figure 2:
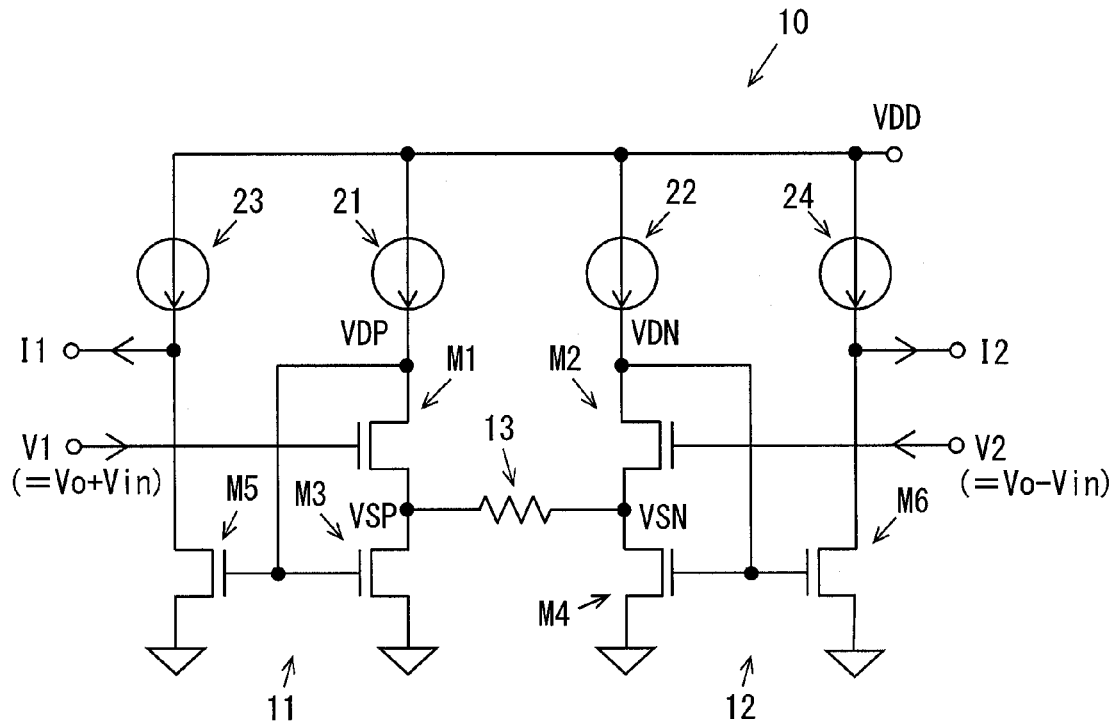
FIG. 2 is a circuit diagram of a voltage current converter provided in the voltage-controlled oscillator shown in FIG. 1.

As shown in FIG. 2, the VI converter 10 includes a first transistor M1 and a second transistor M2. The first transistor M1 and the second transistor M2 are N-channel MOSFETs and have the same size and same characteristics.

A drain terminal of the first transistor M1 is connected to a first constant current source 21. A drain terminal of the second transistor M2 is connected to a second constant current source 22.

The VI converter 10 includes, in addition to the first transistor M1, the second transistor M2, the constant current source 21 and the constant current source 22, a third transistor M3 to a sixth transistor M6, a resistor 13, a third constant current source 23 and a fourth constant current source 24. Similarly to the first transistor M1 and the second transistor M2, the third transistor M3 to the sixth transistor M6 are N-channel MOSFETs and have the same size and same characteristics. The constant current sources 21 to 24 are connected to a common power supply voltage VDD.

A source terminal of the first transistor M1 is connected to a drain terminal of the third transistor M3. A source terminal of the third transistor M3 is connected to the ground. Thus, the constant current source 21, the first transistor M1 and the third transistor M3 are connected in series.

The first control voltage V1 is applied to a gate terminal of the first transistor M1. The first control voltage V1 equals a sum of an input voltage Vin and an offset voltage VDD.

A drain terminal and a source terminal of the fifth transistor M5 is connected to the constant current source 23 and the ground, respectively. The fifth transistor M5 and the constant current source 23 are parallel to the constant current source 21, the first transistor M1 and the third transistor M3.

A gate terminal of the third transistor M3 is connected to the drain terminal of the first transistor M1. That is, the drain terminal of the third transistor M3 is diode-connected to the gate terminal of the third transistor M3 through the first transistor M1. The gate terminal of the third transistor M3 is connected to the gate terminal of the fifth transistor M5. Thus the third transistor M3 and the fifth transistor M5 form a first current mirror circuit 11.

The second transistor M2, the fourth transistor M4 and the sixth transistor M6 are connected in the same manner as the first transistor M1, the third transistor M3 and the fifth transistor M5.

Specifically, a source terminal of the second transistor M2 is connected to a drain terminal of the fourth transistor M4. A source terminal of the fourth transistor M4 is connected to the ground. Therefore the constant current source 22, the second transistor M2 and the fourth transistor M4 are connected in series.

The second control voltage V2 is applied to a gate terminal of the second transistor M2. The second control voltage V2 equals a difference of the input voltage Vin from the offset voltage Vo. The input voltage Vin is the high frequency signal. The first control voltage V1 and the second control voltage V2 are sums of the offset voltage Vo and the input voltage ±Vin, which is in a differential relation. Therefore the first control voltage V1 (=Vo+Vin) and the second control voltage V2 (=Vo+Vin) are also signals, which are in the differential relation.

A drain terminal and a source terminal of the sixth transistor M6 are connected to the source 24 and the ground, respectively. The sixth transistor M6 and the constant current source 24 are parallel to the constant current source 22, the second transistor M2 and the fourth transistor M4.

A gate terminal of the fourth transistor M4 is connected to the drain terminal of the second transistor M2. That is, the drain terminal of the fourth transistor M4 is diode-connected to the gate terminal of the fourth transistor M4 through the second transistor M2. The gate terminal of the fourth transistor M4 is connected to a gate terminal of the sixth transistor M6. Thus the fourth transistor M4 and the sixth transistor M6 form a second mirror circuit 12.

The resistor 13 is connected to the source terminal of the first transistor M1 and the drain terminal of the third transistor M3 at its one end and to the source terminal of the second transistor M2 and the drain terminal of the fourth transistor M4 at its other end. The resistor 13 is a fixed resistor.

An operation of the VI converter 10 configured as described above will be described below. Since the first control voltage V1 is applied to the gate terminal of the first transistor M1, a source voltage VSP of the first transistor M1 becomes a voltage, which is lower than a drain voltage VDP of the first transistor M1 by a voltage amount corresponding to the first control voltage V1.

Similarly, since the second control voltage V2 is applied to the gate terminal of the second transistor M2, a source voltage VSN of the second transistor M2 is lower than a drain voltage VDN of the second transistor M2 by a voltage amount corresponding to the second control voltage V2.

For this reason, an inter-terminal voltage of the resistor 13 equals a differential voltage (voltage difference) between the first control voltage V1 and the second control voltage V2. That is, the voltage applied to the resistor 13 is defined as V1−V2=Vo+Vin−(Vo−Vin)=2×Vin. Since the voltage applied to the resistor 13 is 2×Vin, a current Io which flows in the resistor 13 is defined as Io=2×Vin/RS, in which RS indicates a resistance (Ω) of the resistor 13.

Since the resistor 13 is connected between the drain terminal of the third transistor M3 and the drain terminal of the fourth transistor M4, amounts of variations of the currents flowing in the third transistor M3 and the fourth transistor M4 are also Io.

Since the first current mirror circuit 11 and the second current mirror circuit 12 are provided, amounts of variations of the currents flowing in the fifth transistor M5 and the sixth transistor M6 are also Io. The currents, which flow in the fifth transistor M5 and the sixth transistor M6, are in the differential relation to each other.

Amounts of variations of a first output current I1 outputted from a node between the drain terminal of the fifth transistor M5 and the constant current source 23 and a second output current I2 outputted from a node between the drain terminal of the sixth transistor M6 and the source 24 are also Io and are in the differential relation to each other.

(Ring Oscillators 30 and 40)

Figure 3A:
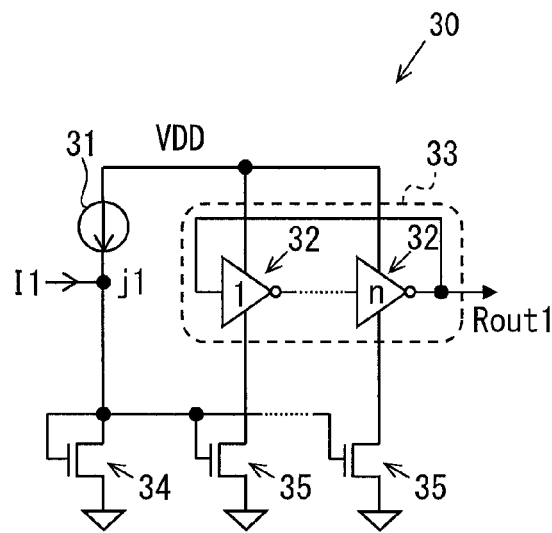
FIG. 3A and FIG. 3B are circuit diagrams of a first ring oscillator and a second ring oscillator provided in the voltage-controlled oscillator shown in FIG. 1, respectively.
Figure 3B:
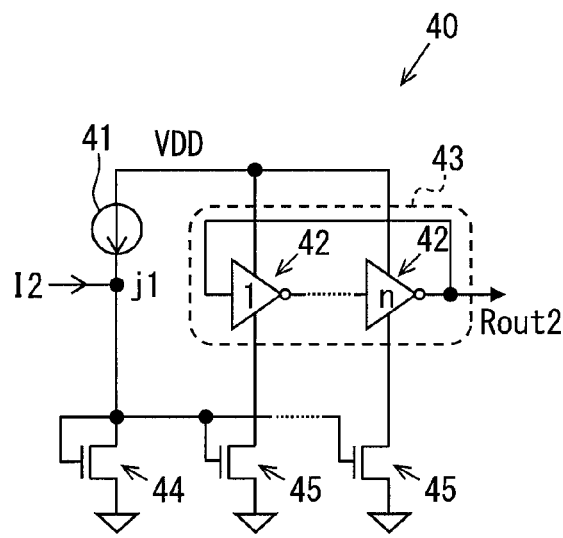

As shown in FIG. 3A and FIG. 3B, the first ring oscillator 30 and the second ring oscillator 40 have the same configurations and are different only in respect of input currents. The first ring oscillator 30 and the second ring oscillator 40 have conventional configurations.

The first ring oscillator 30 shown in FIG. 3A includes a constant current source 31 and an inverter ring circuit 33, in which "n" (odd number) pieces of inverters 32 are connected in a ring form. The inverter 32 is a delay element. The first ring oscillator 30 further includes a transistor 34, which is connected between the constant current source 31 and the ground, and transistors 35, which are connected between negative power supply terminals of the inverters 32 and the ground, respectively. The transistors 34 and 35 are N-channel MOSFETs and have the same size and same characteristics.

The power supply voltage VDD is supplied to the constant current source 31 and the inverter ring circuit 33. The output current I1 of the first current mirror circuit 11 is supplied to a node j1, which is between the constant current source 31 and a drain terminal of the transistor 34. For this reason, a voltage of the drain terminal of the transistor 34 is proportional to a sum of the current flowing in the constant current source 31 and the first output current I1. Since the drain terminal and a gate terminal of the transistor 34 are connected, the voltage of the gate terminal of the transistor 34 equals the voltage of the drain terminal of the transistor 34.

Further, since the drain terminal of the transistor 34 and gate terminals of the transistors 35, which are connected to the inverters 32, are connected, the voltages of the gate terminals of the transistors 35 equal the voltage of the drain terminal of the transistor 34.

According to the configuration described above, since the voltage between the positive and negative power supply terminals of each inverter 32 varies, the first ring oscillator 30 outputs the first oscillation signal Rout1, which oscillates at a first oscillation frequency f1 corresponding to a magnitude of the first output current I1 of the VI converter 10.

The second ring oscillator 40 includes a constant current source 41, an inverter ring circuit 43, in which "n" (odd number) pieces of inverters 42 are connected in a ring form, a transistor 44 and transistors 45. The transistors 45 are connected between the negative power supply terminals of the inverters 42 and the ground, respectively. The inverter 42 is a delay element. Those are the same as the constant current source 31, the inverters 32, the inverter ring circuit 33, the transistor 34 and the transistors 35 of the first ring oscillator 30. The second output current I2 of the VI converter 10 is supplied to a node j2, which is between the constant current source 41 and the drain terminal of the transistor 44.

Accordingly, the second ring oscillator 40 outputs the second oscillation signal Rout2, which oscillates at a second oscillation frequency f2 corresponding to a magnitude of the second output current I2 of the VI converter 10.

Figure 4:
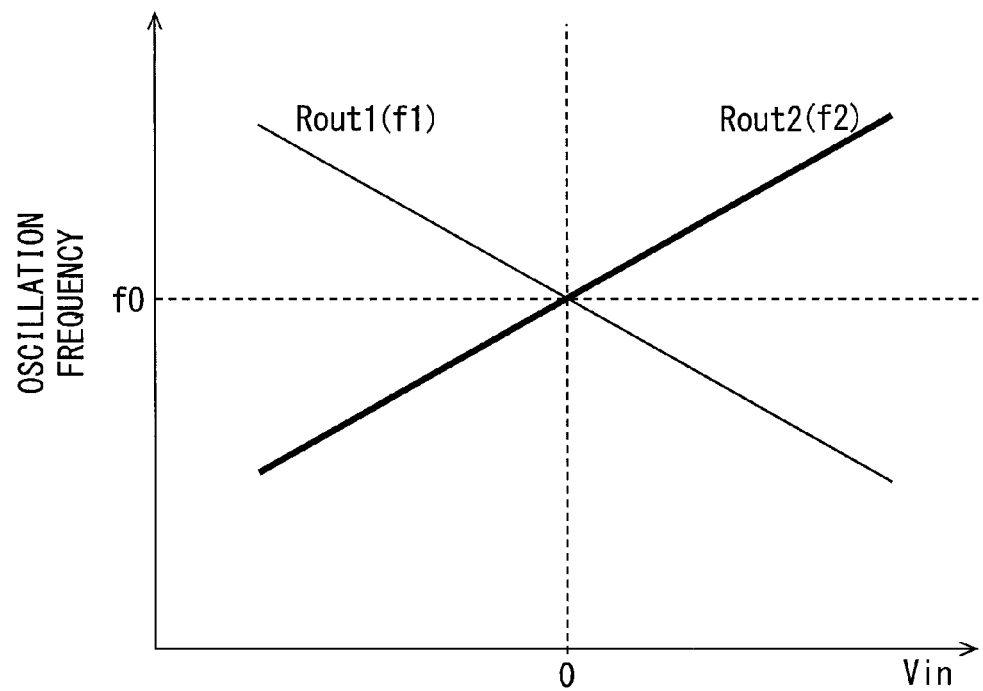
FIG. 4 is a characteristic graph showing frequency changes in a first oscillation signal and a second oscillation signal generated by the first ring oscillator and the second ring oscillator shown in FIG. 3A and FIG. 3B, respectively, relative to an input voltage.

The first output current I1 and the second output current I2 correspond to magnitudes of the first control voltage V1 and the second control voltage V2, respectively. The first control voltage V1 and the second control voltage V2 are differential voltages, which vary around the offset voltage Vo by an amount of ±Vin. For this reason, as shown in FIG. 4, the first frequency f1 of the first oscillation signal Rout1 decreases relative to an increase in the input voltage Vin and the second frequency f2 of the second oscillation signal Rout2 increases relative to an increase in the input voltage Vin. When the input voltage Vin is 0, the frequency of the first oscillation signal Rout1 and the second oscillation signal Rout2 are both the same frequency f0.

As described above, the VI converter 10 provided in the voltage-controlled oscillator 1 converts the first control voltage V1 and the second control voltage V2 to the first output current I1 and the second output current I2, respectively, by four transistors M1 to M4. Since a voltage is converted to a current with a small number of transistors, power consumption is saved.

The first output current I1 and the second output current I2 vary linearly in correspondence to a difference between the first control voltage V1 and the second control voltage V2. This voltage difference is less likely to be affected by frequencies of the first control voltage V1 and the second control voltage V2. Accordingly, the first output current I1 and the second output current I2 have good proportionality to the first control voltage V1 and the second control voltage V2, respectively, even when the first control voltage V1 and the second control voltage V2 are high frequency signals.

The first ring oscillator 30 and the second ring oscillator 40 output the first oscillation signal Rout1 and the second oscillation signal Rout2 in response to the first output current I1 and the second output current I2 as inputs, respectively. Thus the voltage-controlled oscillator 1 outputs the oscillation signals Rout1 and Rout2, which change respective frequencies f1 and f2 in good proportional relation to changes in the first control voltage V1 and the second control voltage V2, even when the first control voltage V1 and the second control voltage V2 are high frequency signals.

Further, according to the present embodiment, the first control voltage V1 and the second control voltage V2, which are differential signals, are converted into the first output current I1 and the second output current I2, respectively, by one VI converter 10.

Second Embodiment

Figure 5:
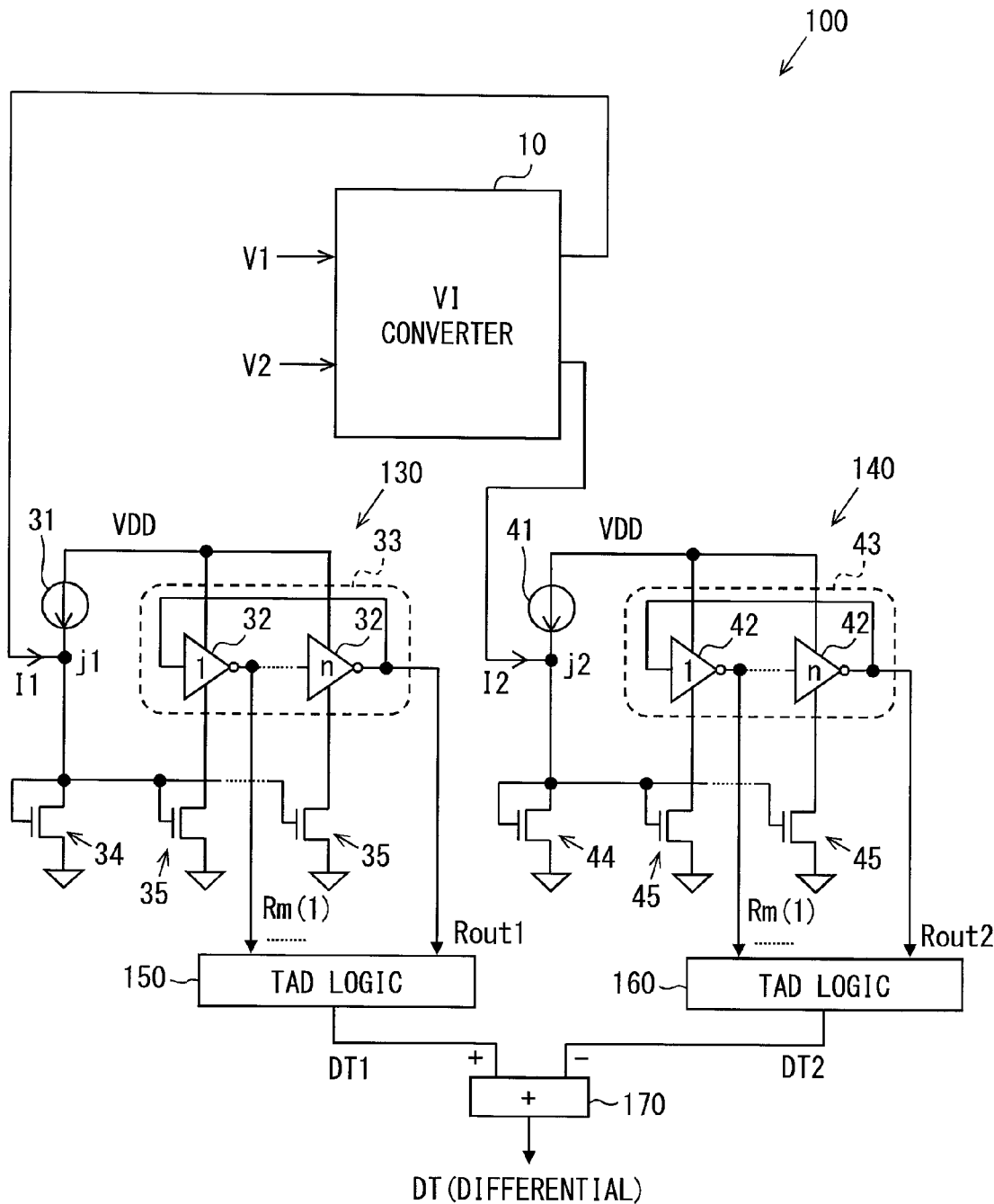
FIG. 5 is a circuit diagram of an analog-digital converter according to a second embodiment, which is provided with the voltage-controlled oscillator shown in FIG. 1.

In a second embodiment, the VI converter 1 described above is provided in an analog-digital converter (AD converter) 100 as shown in FIG. 5. In the second and subsequent embodiments, same structural elements as in preceding embodiments are designated with the same reference numerals unless otherwise described differently.

The AD converter 100 includes the VI converter 10, which is the same as the first embodiment. The AD converter 100 includes a first ring oscillator 130, a second ring oscillator 140, a first time analog-digital (TAD) logic circuit 150, a second TAD logic circuit 160 and a subtractor 170. The first TAD logic circuit 150 and the second TAD logic circuit 160 are provided as a first encoder circuit and a second encoder circuit, respectively.

The first ring oscillator 130 has the same configuration as the first ring oscillator 30 in the first embodiment except that the output of each inverter 32 is applied to the first TAD logic circuit 150. The output of the inverter 32 of the last stage ("n"th inverter) is the first oscillation signal Rout1 in the first embodiment. Output signals of other inverters 32 are designated as Rm(n).

The second ring oscillator 140 has the same configuration as the first ring oscillator 130 and as the second ring oscillator 40 in the first embodiment except that the output of each inverter 42 is inputted to the second TAD logic circuit 160. The output of the inverter 42 of the last stage ("n"th inverter) is the second oscillation signal Rout2 in the first embodiment. Output signals of other inverters 42 are designated as Rm(n).

The first TAD logic circuit 150 is a conventional TAD logic circuit and detects the number of circulations (circulation number) of a signal through the inverter ring circuit 33 in a predetermined period and a circulation position of the signal in the inverter ring circuit 33. The first TAD logic circuit 150 thus outputs digital data, which indicates numeric values of the detected circulation number and circulation position, as first AD conversion data DT1. The circulation position of the signal in the inverter ring circuit 33 indicates the number of stages of the inverter 32, which changes its output level between high level and low level.

The second TAD logic circuit 160 has the same configuration as the first TAD logic circuit 150. The second TAD logic circuit 160 thus detects the number of circulations of a signal through the inverter ring circuit 43 in the predetermined period and a circulation position of the signal in the inverter ring circuit 43. The second TAD logic circuit 160 thus outputs digital data, which indicates numeric values of the detected circulation number and circulation position, as second AD conversion data DT2. The subtractor 170 subtracts the second AD conversion data DT2 from the first AD conversion data DT1.

Figure 6:
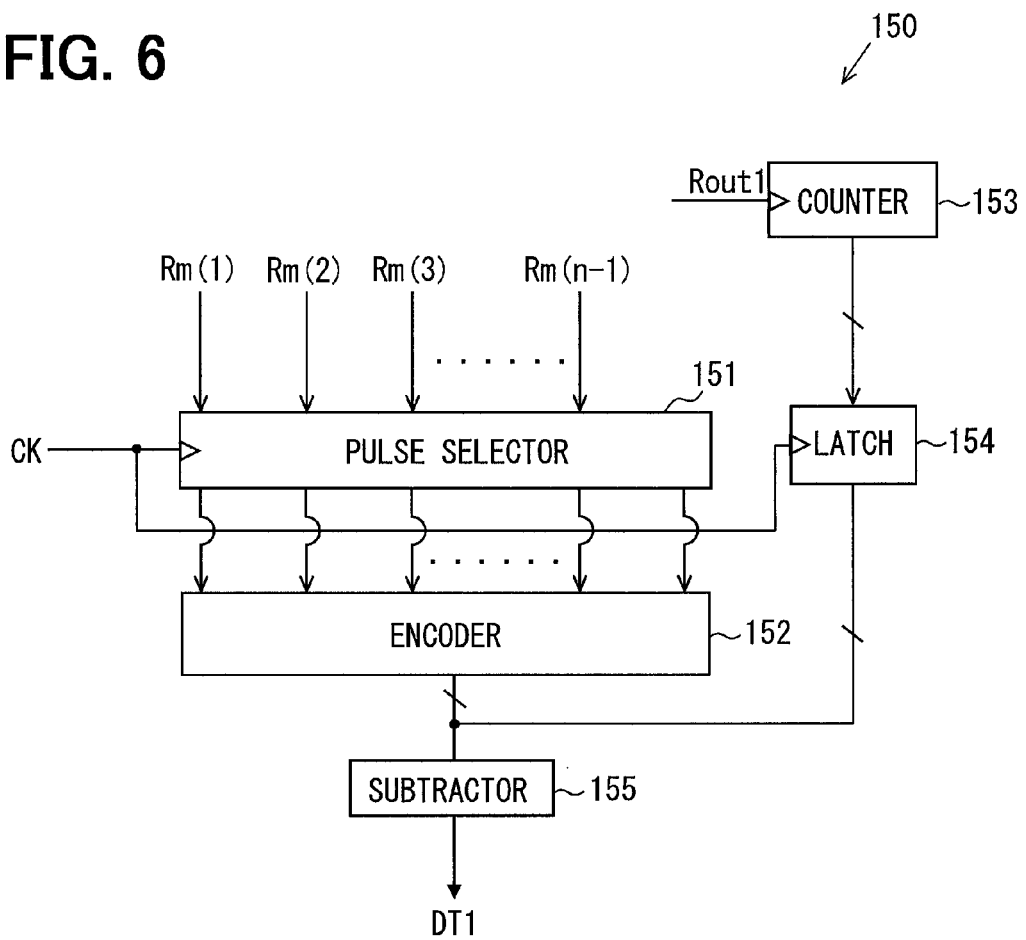
FIG. 6 is a circuit diagram of a TAD logic circuit provided in the analog-digital converter shown in FIG. 5.

The first TAD logic circuit 150 is configured as shown in FIG. 6. The first TAD logic circuit 150 has the similar configuration, which detects the circulation number and the circulation position of a signal passing through a pulse circulation circuit as disclosed in JP H05-259907 A (U.S. Pat. No. 5,396,247). Specifically the first TAD logic circuit 150 includes a pulse selector 151, an encoder 152, a counter 153, a latch circuit 154 and a subtractor 155.

The pulse selector 151 detects the circulation position of the signal in the inverter ring circuit 33 based on the output signals R outputted from the inverters 32 in the inverter ring circuit 33 and outputs a signal indicating the circulation position to the encoder 152.

The encoder 152 generates digital data corresponding to signals applied from the pulse selector 151.

The counter 153 counts the number of changes of the output level of the inverter 32, which is in the last ("n"th) stage of the inverter ring circuit 33, that is, the number of times of inversions of the first oscillation signal Rout1, and outputs digital data indicating the count number to the latch circuit 154. The count number indicates the circulation number indicating the number of times of circulation of the signal through the inverter ring circuit 33.

The latch circuit 154 latches the digital data outputted from the counter 153. The latched digital data is outputted to the subtractor 155. Clock signals CK are applied to the latch circuit 154 and the pulse selector 151 at every predetermined interval. The latch circuit 154 and the pulse selector 151 output respective digital data each time the clock signals are inputted.

The digital data of the latch circuit 154 and the digital data of the encoder 152 are inputted to the subtractor 155 as more significant bits (higher bits) and less significant bits (lower bits), respectively. Based on digital data, which are generated based on the digital data from the latch circuit 154 and the digital data from the encoder 152, the first AD conversion data DT1 is outputted as a first digital conversion data, which indicates the number of counts between the previous input of the clock signal CK and the present input of the clock signal CK. Since the oscillation signal Rout 1 varies with the first control voltage V1, the first AD conversion data DT1 also varies with the first control voltage V1.

The second TAD logic circuit 160 has the same configuration as the first TAD logic circuit 150 described above. Therefore, the second TAD logic circuit 160 outputs the second AD conversion data DT2, which varies with the second control voltage V2.

The AD converter 100 according to the second embodiment includes the VI converter 10 of the first embodiment. The VI converter 10 outputs the first and second oscillation signals Rout1 and Rout2, which change respective frequencies in good proportional relation to changes in the first and second control voltages V1 and V2 with low power consumption, even when the first and second control voltages V1 and V2 are high frequency signals.

Thus the AD converter 100 according to the second embodiment outputs the first and second AD conversion data DT1 and DT2, which indicate the first control voltage V1 and the second control voltage V2 precisely, respectively, with low power consumption, even when the first control voltage V1 and the second control voltage V2 are high frequency signals.

Since the first AD conversion data DT1 and the second AD conversion data DT2 are in the differential relation to each other, the subtraction output data of the subtractor 170 has a resolution of twice as high as that of each conversion data DT1 and DT2.

Third Embodiment

Figure 7:
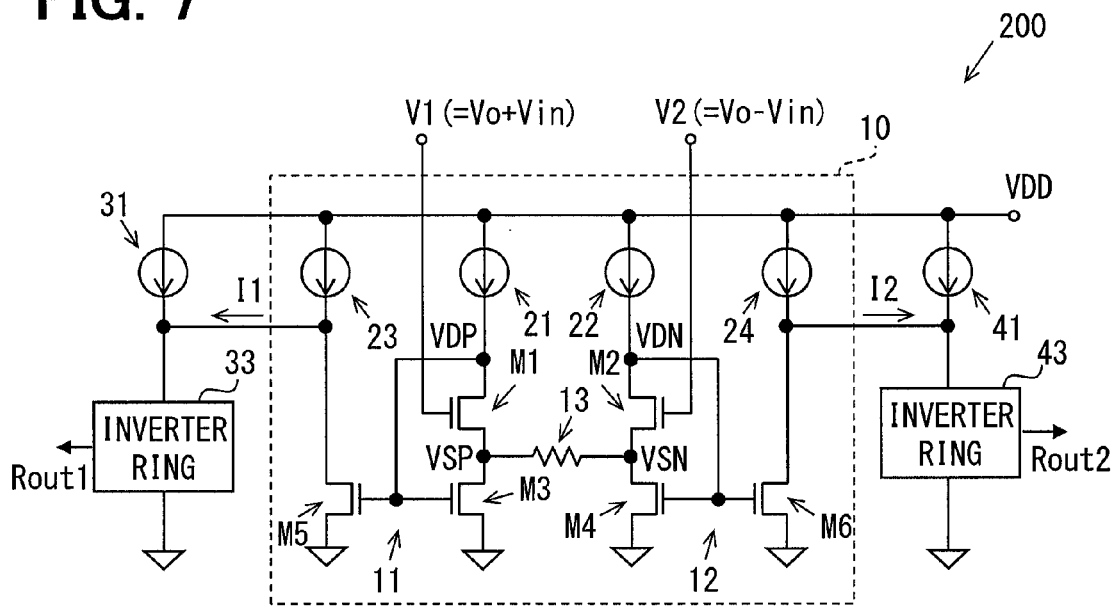
FIG. 7 is a circuit diagram of a voltage-controlled oscillator according to a third embodiment.

A voltage-controlled oscillator 200 according to a third embodiment includes, as shown in FIG. 7, the VI converter 10, which is also provided in the first embodiment. The voltage-controlled oscillator 200 further includes constant current sources 31 and 41 in addition to the inverter ring circuits 33 and 43, which are also provided in the first embodiment. In the third embodiment as well, the constant current sources 31 and 41 are connected to the power supply voltage VDD.

In the third embodiment, the inverter ring circuit 33 is provided as the first ring oscillator and the inverter ring circuit 43 is provided as the second ring oscillator. These inverter ring circuits 33 and 43 are arranged differently from the first embodiment. In the third embodiment, the inverter ring circuit 33 is connected in series with the constant current source 31 and in parallel to the fifth transistor M5. The inverter ring circuit 43 is connected in series with the constant current source 41 and in parallel to the sixth transistor M6.

As a result, a composite current of a constant current outputted from the constant current source 31 and the first output current I1 outputted from the VI converter 10 is supplied to the positive power supply terminal of each inverter 32 of the inverter ring circuit 33. Further, a composite current of a constant current outputted from the constant current source 41 and the second output current I2 outputted from the VI converter 10 is supplied to the positive power supply terminal of each inverter 42 of the inverter ring circuit 43. In the third embodiment, the constant current source 31 is provided as a current source for the first oscillator and the constant current source 41 is provided as a current source for the second oscillator.

According to the third embodiment, the voltages between positive and negative power supply terminals of each inverter 32 and 42 of the inverter ring circuits 33 and 43 vary with the magnitudes of the first output current I1 and the second output current I2, respectively. The third embodiment thus also provides the similar advantage as the first embodiment.

Fourth Embodiment

Figure 8:
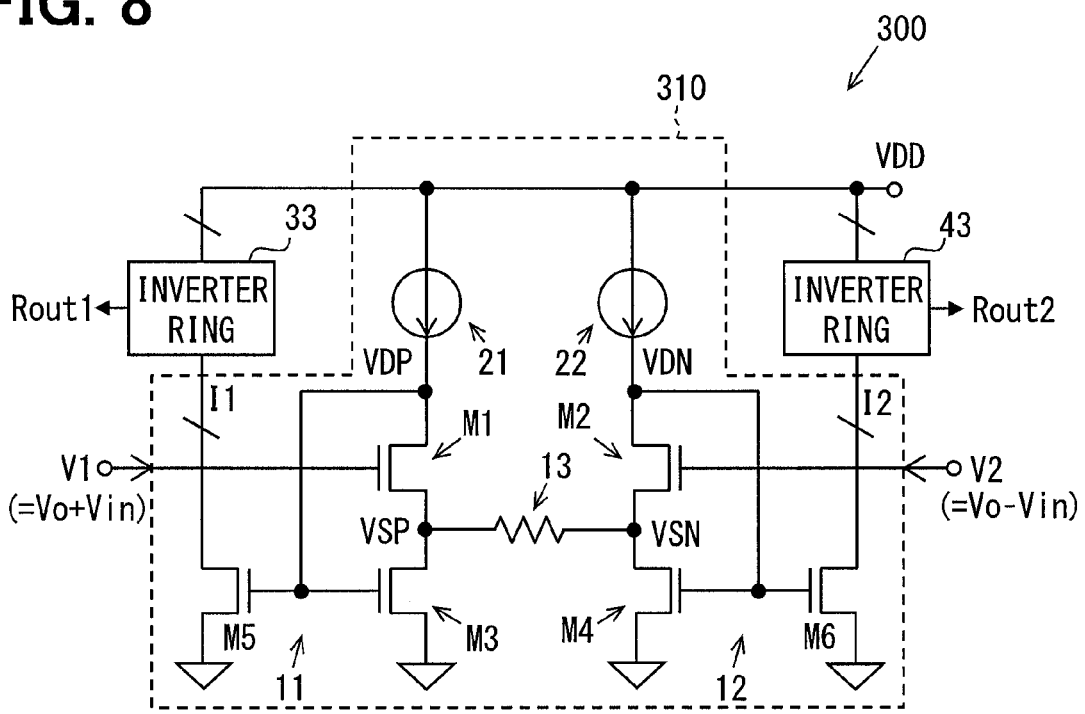
FIG. 8 is a circuit diagram of a voltage-controlled oscillator according to a fourth embodiment.

A voltage-controlled oscillator 300 according to a fourth embodiment shown in FIG. 8 includes a VI converter 310 as well as the inverter ring circuits 33 and 43. The VI converter 310 corresponds to the VI converter 10 of the first embodiment except that the constant current sources 23 and 24 are not provided.

In the fourth embodiment, the inverter ring circuits 33 and 43 are provided as the first ring oscillator and the second ring oscillator, respectively. The inverter ring circuits 33 and 43 are arranged at positions, where the constant current sources 23 and 24 are arranged, respectively, in the first embodiment.

That is, in the fourth embodiment, the inverter ring circuit 33 is connected to the power supply voltage VDD, connected in series with the fifth transistor M5 and connected in parallel to the constant current sources 21 and 22. Further, the inverter ring circuit 43 is connected to the power supply voltage VDD, connected in series with the sixth transistor M6 and connected in parallel to the constant current sources 21 and 22.

More specifically, the positive power supply terminal and the negative power supply terminal of each inverter 32 of the inverter ring circuit 33 are connected to the power supply voltage VDD and the drain terminal of the fifth transistor M5, respectively. The positive power supply terminal and the negative power supply terminal of each inverter 42 of the inverter ring circuit 43 are connected to the power supply voltage VDD and the drain terminal of the sixth transistor M6, respectively.

According to the fourth embodiment, the first output current I1 flows in the fifth transistor M5 and the second output current I2 flows in the sixth transistor M6. The voltages of the negative power supply terminals of the inverters 32 and 42 vary with the first output current I1 and the second output current I2, respectively.

As a result, the voltage between the positive and negative power supply terminals of the inverter 32 varies with the magnitude of the first output current I1 and the voltage between the positive and negative power supply terminals of the inverter 42 varies with the magnitude of the second output current I2.

The inverter 32 is driven with a driving current, which drives the fifth transistor M5, and the inverter 42 is driven with a driving current, which drives the sixth transistor M6.

The fourth embodiment provides the similar advantage as the first embodiment, since the voltages between the positive and negative power supply terminals of each inverter 32 and 42 vary with the magnitudes of the first output current I1 and the second output current I2, respectively.

Fifth Embodiment

Figure 9:
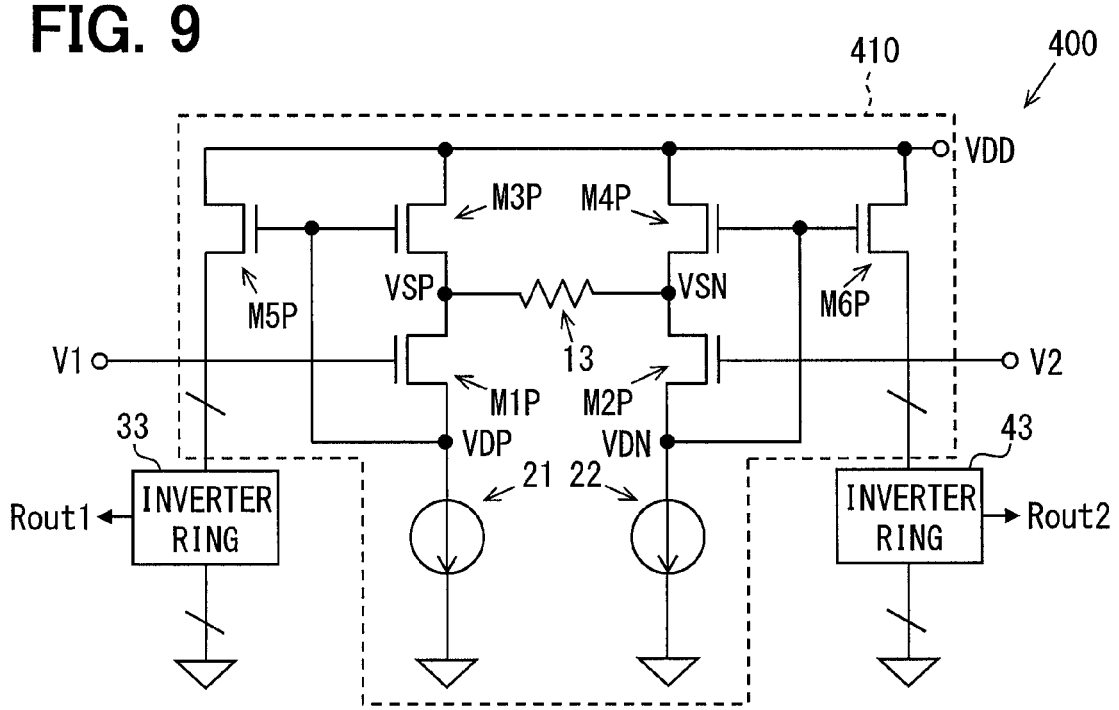
FIG. 9 is a circuit diagram of a voltage-controlled oscillator according to a fifth embodiment.

A voltage-controlled oscillator 400 according to a fifth embodiment shown in FIG. 9 includes a VI converter 410 and the inverter ring circuits 33 and 43. The inverter ring circuits 33 and 43 are provided as the first ring oscillator and the second ring oscillator, respectively.

The VI converter 410 includes a first transistor M1P, a second transistor M2P, a third transistor M3P, a fourth transistor M4P, a fifth transistor M5P and a sixth transistor M6P, which are all P-channel MOSFETs. The VI converter 410 further includes the resistor 13 and the constant current sources 21 and 22.

Since the first transistor M1P to the sixth transistor M6P are P-channel MOSFETs, the first transistor M1P to the sixth transistor M6P, the resistor 13 and the constant current sources 21 and 22 are arranged oppositely in polarity to the arrangement of the VI converter 310 of the fourth embodiment.

The inverter ring circuit 33 is connected between a drain terminal of the fifth transistor M5P and the ground. The inverter ring circuit 43 is connected between a drain terminal of the sixth transistor M6P and the ground. More specifically, the positive power supply terminal and the negative power supply terminal of each inverter 32 of the inverter ring circuit 33 are connected to the drain terminal of the fifth transistor M5P and the ground, respectively. The positive power supply terminal and the negative power supply terminal of each inverter 42 of the inverter ring circuit 43 are connected to the drain terminal of the sixth transistor M6P and the ground, respectively.

According to the fifth embodiment, the voltages between the positive and negative terminals of each inverter 32 and 42 of the inverter ring circuits 33 and 43 vary with the magnitudes of currents, which flow in the fifth transistor M5P and the sixth transistor M6P, respectively. Thus the fifth embodiment also provides the similar advantage as the fourth embodiment.

Sixth Embodiment

Figure 10:
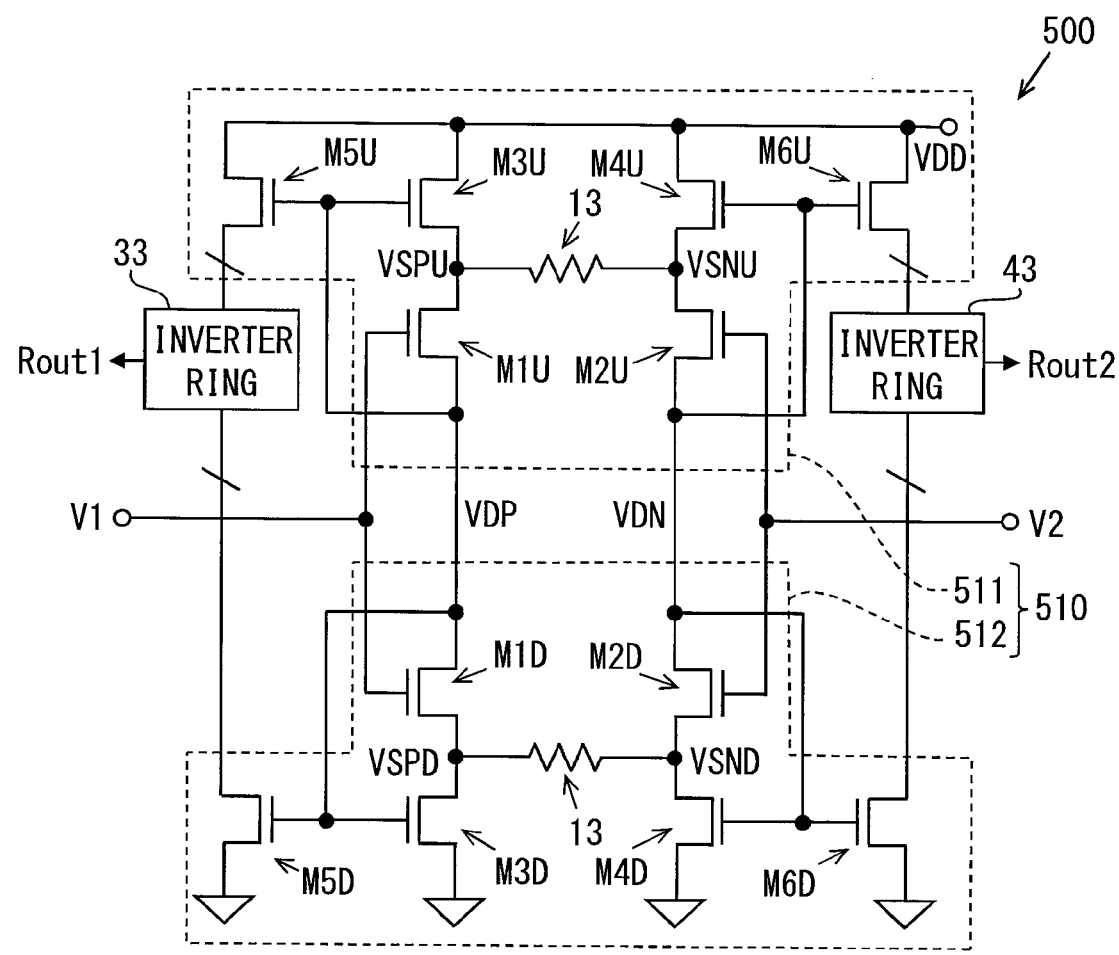
FIG. 10 is a circuit diagram of a voltage-controlled oscillator according to a sixth embodiment.

A voltage-controlled oscillator 500 according to a sixth embodiment shown in FIG. 10 includes a VI converter 510 and the inverter ring circuits 33 and 43. The inverter ring circuits 33 and 43 are provided as the first ring oscillator and the second ring oscillator, respectively.

The VI converter 510 is a CMOS type and includes a high-side circuit 511 and a low-side circuit 512, which are shown in upward side and downward side of FIG. 10. The high-side circuit 511 has the same configuration as the VI converter 410 of the fifth embodiment except that the constant current sources 21 and 22 are not provided. The low-side circuit 512 has the same configuration as the VI converter 310 of the fourth embodiment except that the constant current sources 21 and 22 are not provided.

The high-side circuit 511 includes a high-side first transistor M1U to a high-side sixth transistor M6U and the resistor 13. The high-side first transistor M1U to the high-side sixth transistor M6U are the same as the first transistor M1P to the sixth transistor M6P provided in the VI converter 410, respectively, and connected in the same manner as in the VI converter 410. A current, which flows in the resistor 13 of the high-side circuit 511, is determined by a voltage difference between a source voltage VSPU of the high-side first transistor M1U and a source voltage VSNU of the high-side second transistor M2U and the resistance value of the resistor 13.

The low-side circuit 512 includes a low-side first transistor M1D to a low-side sixth transistor M6D and the resistor 13. The low-side first transistor M1D to the low-side sixth transistor M6D are the same as the first transistor M1 to the sixth transistor M6 provided in the VI converter 310, respectively, and connected in the same manner as in the VI converter 310. A current, which flows in the resistor 13 of the low-side circuit 512, is determined by a voltage difference between a source voltage VSPD of the low-side first transistor M1D and a source voltage VSND of the low-side second transistor M2D and the resistance value of the resistor 13.

A drain terminal of the high-side first transistor M1U and a drain terminal of the low-side first transistor M1D are connected to each other. A drain terminal of the high-side second transistor M2U and a drain terminal of the low-side second transistor M2D are connected to each other.

The first control voltage V1 is applied to a gate terminal of the high-side first transistor M1U and a gate terminal of the low-side first transistor M1D. The second control voltage V2 is applied to a gate terminal of the high-side second transistor M2U and a gate terminal of the low-side second transistor M2D.

The inverter ring circuit 33 is provided between the high-side fifth transistor M5U and the low-side fifth transistor M5D and connected in series with the high-side fifth transistor M5U and the low-side fifth transistor M5D. The inverter ring circuit 43 is provided between the high-side sixth transistor M6U and the low-side sixth transistor M6D and connected in series with the high-side sixth transistor M6U and the low-side sixth transistor M6D.

More specifically, a drain terminal of the high-side fifth transistor M5U is connected to the positive power supply terminal of each inverter 32 of the inverter ring circuit 33. A drain terminal of the low-side fifth transistor M5D is connected to the negative power supply terminal of each inverter 32. A drain terminal of the high-side sixth transistor M6U is connected to the positive power supply terminal of each inverter 42 of the inverter ring circuit 43. A drain terminal of the low-side sixth transistor M6D is connected to the negative power supply terminal of each inverter 42.

The VI converter 510 according to the sixth embodiment includes the high-side circuit 511 and the low-side circuit 512, which have the same configurations as the VI converter 410 of the fifth embodiment and the VI converter 310 of the fourth embodiment except for the constant current sources 21 and 22, respectively. Accordingly, relative to the fourth and fifth embodiments, currents of twice as large flow in the inverter ring circuits 33 and 43 when the first and second control voltages V1 and V2 are applied. The oscillation frequencies of the first oscillation signal Rout1 and the second oscillation signal Rout2 are increased. With the increased oscillation frequencies, the AD converter using the voltage-controlled oscillator 500 operates with high resolution.

The voltage-controlled oscillator and the AD converter described above are not limited to the disclosed embodiments but may be implemented differently with the following exemplary modifications.

First Modification

For example, in the AD converter 100 according to the second embodiment, any one of the voltage-controlled oscillators 200, 300, 400 and 500 of the third to sixth embodiments may be used in place of the VI converter 10.

Second Modification

In the inverter ring circuits 33 and 43, a NAND circuit may be connected to an input side of the first-stage inverter and the pulse signal may be applied to the NAND circuit in the similar manner as the pulse circulation circuit disclosed in JP H05-259907 (U.S. Pat. No. 5,396,247).

Third Modification

The resistor 13 may be a variable resistor. In this modification, the resistance value of the resistor 13 is increased as the control voltages V1 and V2 increase, respectively. With increased resistance value, the first output current I1 and the second output current I2 are decreased. That is, the magnitudes of the output currents I1 and I2 relative to the control voltages V1 and V2, that is, sensitivity of the output currents I1 and I2 relative to the control voltages V1 and V2, are made adjustable by the resistance value.

In some conventional devices, a variable-gain amplifier is provided to limit a voltage, which is applied to the AD converter. However, such a variable-gain amplifier need not be provided at the preceding stage of the AD converter by using the variable resistor as the resistor 13 and adjusting the sensitivity of the output currents I1 and I2 relative to the control voltages V1 and V2 by the resistance value of the resistor 13. The resistance value of the resistor 13 may be controlled by a control part, which controls the resistance value in accordance with the output of the AD converter.

The invention claimed is:
1. A voltage-controlled oscillator comprising:
a voltage-current converter for receiving a first control voltage and a second control voltage and outputting a first output current proportional to the first control voltage and a second output current proportional to the second control voltage;
a first ring oscillator including plural delay elements connected in a ring form and oscillating based on the first output current, which the voltage-current converter outputs in response to the first control voltage; and
a second ring oscillator including plural delay elements connected in a ring form and oscillating based on the second output current, which the voltage-current converter outputs in response to the second control voltage,
wherein the voltage-current converter includes:
a first transistor for receiving the first control voltage at a gate terminal thereof;
a second transistor for receiving the second control voltage at a gate terminal thereof;

a third transistor connected to the first transistor in series and having a gate terminal connected to a drain terminal of the first transistor;

a fourth transistor connected to the second transistor in series and having a gate terminal connected to a drain terminal of the second transistor;

a resistor connected to a source terminal of the first transistor and a source terminal of the second transistor;

a fifth transistor having a gate terminal connected to the drain terminal of the first transistor; and a sixth transistor having a gate terminal connected to the drain terminal of the second transistor.

2. The voltage-controlled oscillator according to claim 1, wherein:

the first control voltage and the second control voltage are differential signals.

3. The voltage-controlled oscillator according to claim 1, wherein:

the resistor is a variable resistor.

4. The voltage-controlled oscillator according to claim 1, further comprising:

a first constant current source for driving the first ring oscillator; and a second constant current source for driving the second ring oscillator, wherein the fifth transistor and the first ring oscillator are connected in parallel to each other, and the sixth transistor and the second ring oscillator are connected in parallel to each other.

5. The AD converter according to claim 4 further comprising:

a first encoder circuit for detecting a circulation number indicating a number of circulations of a signal in the first ring oscillator and a circulation position indicating a position of circulation of the signal in the first ring oscillator and outputting as first AD conversion data a first numeric value indicating the circulation number and the circulation position in the first encoder circuit; and a second encoder circuit for detecting a circulation number indicating a number of circulations of a signal in the second ring oscillator and a circulation position indicating a position of circulation of the signal in the second ring oscillator and outputting as second AD conversion data a second numeric value indicating the circulation number and the circulation position in the second encoder circuit.

6. The voltage-controlled oscillator according to claim 1, wherein:

the fifth transistor and the first ring oscillator are connected in series to each other;

the first ring oscillator is driven with a driving current, which drives the fifth transistor;

the sixth transistor and the second ring oscillator are connected in series to each other; and the second ring oscillator is driven with a driving current, which drives the sixth transistor.

7. The AD converter according to claim 6 further comprising:

a first encoder circuit for detecting a circulation number indicating a number of circulations of a signal in the first ring oscillator and a circulation position indicating a position of circulation of the signal in the first ring oscillator and outputting as first AD conversion data a first numeric value indicating the circulation number and the circulation position in the first encoder circuit; and a second encoder circuit for detecting a circulation number indicating a number of circulations of a signal in the second ring oscillator and a circulation position indicating a position of circulation of the signal in the second ring oscillator and outputting as second AD conversion data a second numeric value indicating the circulation number and the circulation position in the second encoder circuit.

8. An AD converter comprising:

the voltage-controlled oscillator according to claim 1;

a first encoder circuit for detecting a circulation number indicating a number of circulations of a signal in the first ring oscillator and a circulation position indicating a position of circulation of the signal in the first ring oscillator and outputting as first AD conversion data a first numeric value indicating the circulation number and the circulation position in the first encoder circuit; and a second encoder circuit for detecting a circulation number indicating a number of circulations of a signal in the second ring oscillator and a circulation position indicating a position of circulation of the signal in the second ring oscillator and outputting as second AD conversion data a second numeric value indicating the circulation number and the circulation position in the second encoder circuit.

9. The AD converter according to claim 8, further comprising:

a subtractor for calculating a difference between the first AD conversion data outputted from the first encoder circuit and the second AD conversion data outputted from the second encoder circuit.

* * * * *